United States Patent [19]
Albers et al.

[11] Patent Number: 5,243,619
[45] Date of Patent: Sep. 7, 1993

[54] PROCESS WHEREIN SEVERAL RADIATION SOURCES, ARRANGED IN ONE ROW OR SEVERAL ROWS, ARE IMAGED, AND APPARATUS FOR THIS PURPOSE

[75] Inventors: Peter Albers, Lausanne; Eckhard Langenbach, St. Gallen; Hans-Jörg Heimbeck, Heerbrugg, all of Switzerland

[73] Assignees: Fisba Optik AG., St. Gallen; Bystronic Laser AG., Niederonz, both of Switzerland; a part intertest

[21] Appl. No.: 785,062

[22] Filed: Oct. 30, 1991

[30] Foreign Application Priority Data

Nov. 1, 1990 [CH] Switzerland .................. 3474/90

[51] Int. Cl.$^5$ .............................................. H01S 3/082
[52] U.S. Cl. ..................................... 372/97; 359/495; 359/625; 359/626; 359/639
[58] Field of Search ............................ 372/70-72, 372/75, 92, 97; 359/494, 495, 496, 618, 619, 625, 626, 639, 640

[56] References Cited

U.S. PATENT DOCUMENTS

| | | | |
|---|---|---|---|
| 4,152,725 | 5/1979 | Beckmann | 358/109 |
| 4,185,891 | 1/1980 | Kaestner | 350/167 |
| 4,306,278 | 12/1981 | Fulton et al. | 362/259 |
| 4,728,196 | 3/1988 | Gerstorfer | 356/446 |
| 4,822,151 | 4/1989 | Tatsuno et al. | 359/495 |
| 5,117,436 | 5/1992 | Hanson | 372/72 |

FOREIGN PATENT DOCUMENTS

0232037 8/1987 European Pat. Off. .
9000752 1/1990 PCT Int'l Appl. .

*Primary Examiner*—John D. Lee
*Assistant Examiner*—Robert E. Wise
*Attorney, Agent, or Firm*—Brady, O'Boyle & Gates

[57] ABSTRACT

In the process and by means of the apparatus, several radiation sources (1) arranged in a row, whose emitted radiation intensity distribution is not rotationally symmetrical, are imaged by means of a first, noncentrically imaging functional element (5), then each beam bundle (9) is rotated by means of a beam-rotating element (7), and the beam components of the rotated beam bundles (9) not imaged by the first functional element (5) are imaged by means of a second, noncentrically imaging functional element (11). The functional elements (5, 11) and their locations are chosen so that parallel beam bundles (9) are produced which are focused with a spherical lens (15) into a spatial zone (3). The apparatus according to this invention provides in a simple way a good focusing ability for several individual beams.

13 Claims, 1 Drawing Sheet

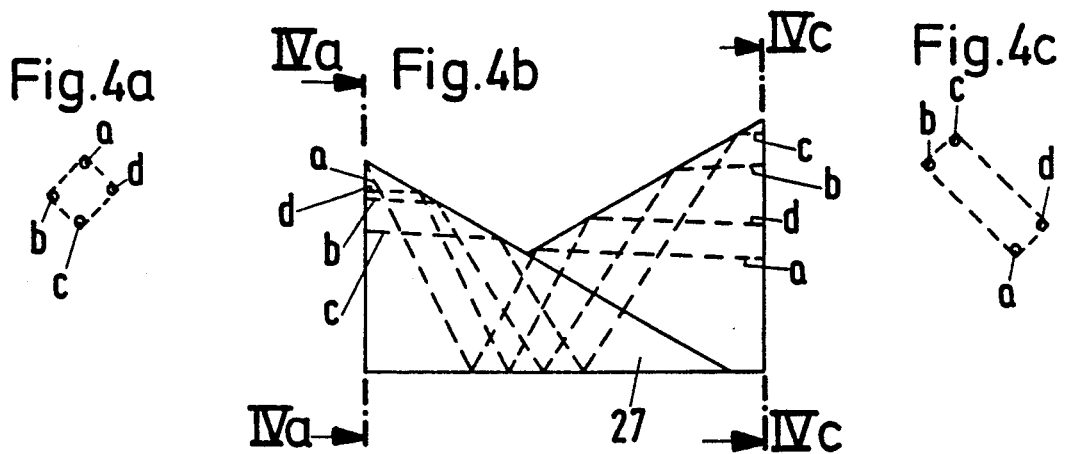
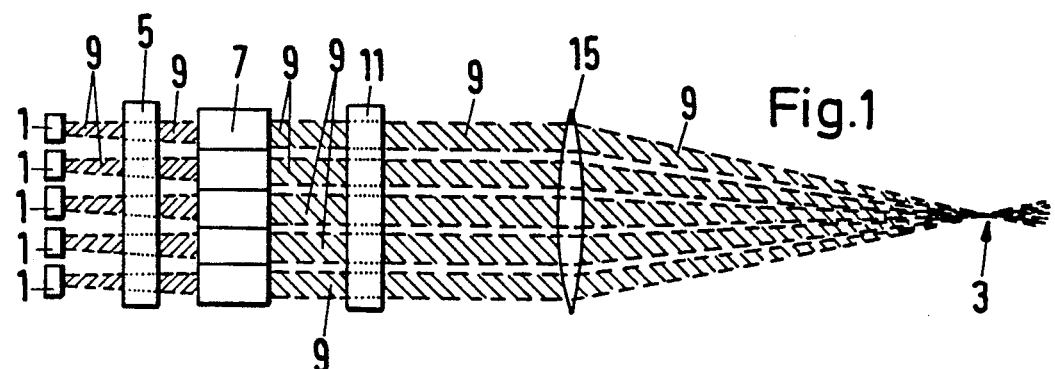
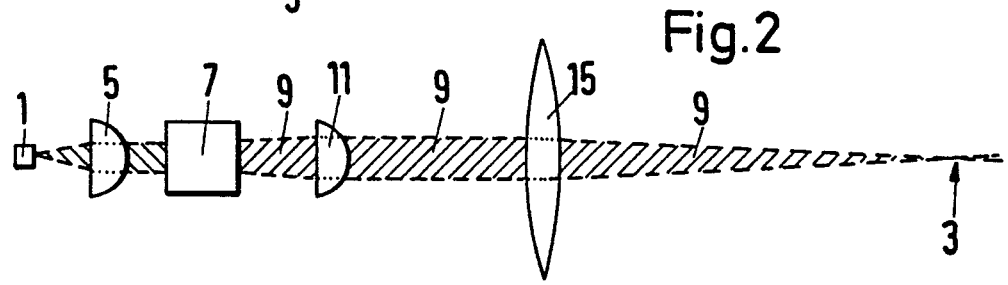
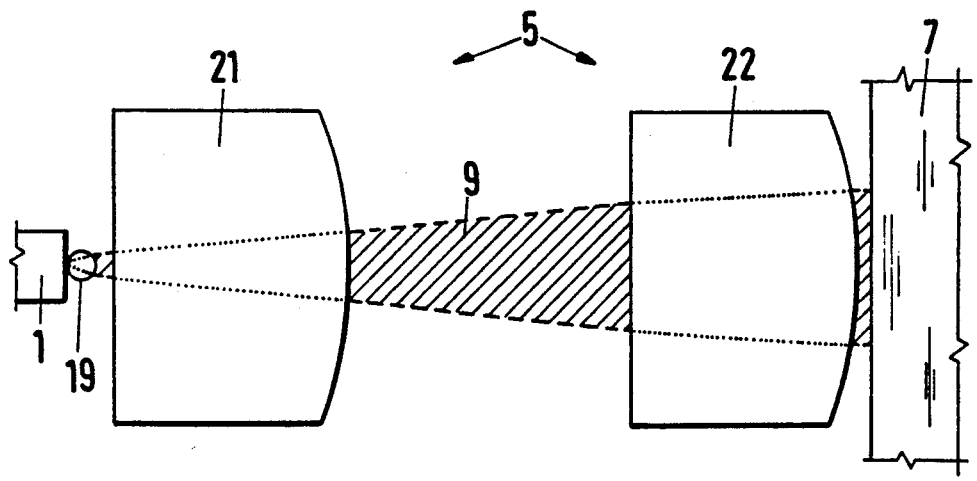

PROCESS WHEREIN SEVERAL RADIATION SOURCES, ARRANGED IN ONE ROW OR SEVERAL ROWS, ARE IMAGED, AND APPARATUS FOR THIS PURPOSE

The invention relates to a process and to an apparatus for imaging into a spatial zone several radiation sources, arranged in one row or several rows.

A process and an apparatus of this type have been known from T. Y. Fan et al., "Scalable, End-Pumped, Diode-Laser-Pumped Laser", Opt. Lett., vol. 14, No. 19, Oct. 1, 1989, pp. 1057–1059. In the conventional process and apparatus, the output radiation of three diode laser arrays with respectively one spherical lens and three successively arranged cylindrical lenses, disposed in superimposed relationship perpendicularly to their p-n planes, was focused on the end side into a ND:YAG laser crystal in order to optically excite the latter. By means of the spherical lenses, having a focal length of 0.4 cm and a numerical aperture of 0.47, the beam components of the beam bundles from the diode lasers lying in planes perpendicularly to the p-n plane are oriented in parallel, and those lying in planes in parallel to the p-n plane are deflected and subsequently likewise oriented in parallel by means of a cylindrical lens. With the aid of the subsequent two cylindrical lenses, the parallel-oriented beams are focused on the end side into the ND:YAG crystal.

Cylindrical lenses pertain to those functional elements that image noncentrically (Heinz Haferkorn, "Optik" [Optic], VEB Deutscher Verlag der Wissenschaften, Berlin, 1980, p. 244). An imaging functional element is a concrete structure which, in its entirety, converts optical input values given in an environment determined in correspondence with a model into given optical output values. The aperture angle is understood to be the angle between two measuring points lying in a plane disposed perpendicularly to the radiating surface at the same radial distance from the center of the line of intersection of the plane with the radiating surface, wherein one measuring point lies perpendicularly above the center and the other measuring point lies at the site where the emitted intensity has dropped to the $1/e^2$-th fraction of the maximum intensity measured in this plane.

As illustrated in the above publication, the radiation sources and the lenses must be carefully aligned.

The invention is based on the object of providing a process and an apparatus permitting good optical imaging of commercially available radiation sources arranged in one row or several rows with an emitted radiation intensity distribution that is not rotationally symmetrical.

One example of an apparatus according to the invention and of a process according to the invention will be described in greater detail below with reference to the drawings wherein:

FIG. 1 is a schematic top view of an apparatus by means of which five diode lasers are imaged into a spatial zone, FIG. 2 is a lateral view of the apparatus shown in FIG. 1, FIG. 3 is a lateral view of the noncentrically imaging functional element arranged directly in front of one of the diode lasers, FIG. 4 is an illustration of the beam path, inclined by 45°, through an Abbe-König prism as the beam-rotating element of the apparatus, a showing the input position of a beam from one of the diode lasers, impinging upon the Abbe-König prism, in viewing direction IVa—IVa in FIG. 4b, b showing the beam path through the Abbe-König prism, and c showing the output position of the beam exiting from the Abbe-König prism in viewing direction IVc—IVc in FIG. 4b.

By means of the apparatus illustrated in FIGS. 1 and 2, the radiation from five diode lasers 1, lying in one row, is focused into a spatial region 3. Each diode laser 1 consists of forty integrated, phase-coupled, radiation-emitting strips arranged in one row in parallel to one another. The spatial zone 3 can be constituted, for example, by the end face of a laser, not illustrated, to be optically energized by the radiation from the diode lasers 1, or by the end face of an optical fiber, not shown, into which the radiation from the diode lasers 1 is to be coupled. In the top view of FIG. 1, the p-n plane of the diode lasers 1 lies in the plane of the sheet of drawing, and in FIG. 2 it lies perpendicularly to this plane. As can be seen from FIGS. 1 and 2, the radiation of the diode lasers 1 is approximately mirror-symmetrical, but not rotationally symmetrical. The radiation of all diode lasers 1 is similar in its radiation emission characteristic. The aperture angle of each beam bundle 9 of the diode lasers 1 is smallest in the plane in parallel to the p-n plane, and largest perpendicularly thereto. In front of the diode lasers 1, a functional element 5 is arranged acting as a cylindrical lens and having a noncentric imaging property, the cylinder axis of this element lying in the p-n plane. The functional element 5 is followed by a beam-rotating element 7 described hereinbelow which rotates the beam bundle 9 of each diode laser 1 by 90°. The beam-rotating element 7 is followed, in turn, by a noncentrically imaging functional element 11 acting as a cylindrical lens, the cylinder axis of which likewise lies in the p-n plane. The output radiation of the functional element 11 is focused by means of a spherical lens 15 as the centrally imaging functional element into the spatial region 3.

The distance of the functional element 5 from the front surface of the diode lasers 1 corresponds to its focal length. The focal length and the aperture of the functional element 5 are chosen so that the imaged beam bundle 9 fits into the aperture of the beam-rotating element 7. The spacing of the functional element 11 from the front faces of the diode lasers 1 is larger by a small tolerance than its focal length, considering the optical path through the beam-rotating element 7. The beam-rotating element 7 is arranged between the two functional elements 5 and 11. The spacing of the spherical lens 15 from the spatial zone 3 corresponds to its focal length.

The beam bundles 9 emitted by the diode lasers 1 pass through the functional element 5 which aligns all beam components lying in planes located perpendicularly to the p-n plane of the diode lasers 1 in parallel, as illustrated in FIG. 2. The beam bundles 9 emitted by the diode lasers 1 exhibit their largest aperture angle perpendicularly to the p-n plane. All beam components lying in planes in parallel to the p-n plane of the diode lasers 1 pass through the functional element 5 in their original direction, as illustrated in FIG. 1; a small beam shift only takes place in the direction of the optical axis, evoked by the index of refraction of the functional element 5 that is higher as compared with the air. The beam bundles 9 emitted by the diode lasers 1 have their smallest aperture angle in parallel to the p-n plane. By means of the beam-rotating element 7, each of the beam bundles 9 is rotated by 90°. In other words, the parallel beam components can now be seen behind the beam-rotating element 7 in FIG. 1, and the unaffected beam components can be seen behind the beam-rotating element 7 in FIG. 2. For identification purposes, a different shading has been chosen for the rotated beam bundles 9. By means of the functional element 11, the still unaffected beam components are now likewise oriented in parallel.

The above-described apparatus, the imaging functional elements 5 and 11 of which and the beam-rotating element 7 of which will be disclosed below, provides a satisfactory focusing ability for several individual beams. The satisfactory focusing ability is attained by the feature that the beam bundles 9 of several diode lasers 1 are superimposed in such a way that the poor beam quality product that cannot be improved with optical functional elements is retained in a plane perpendicular to the beam axis, and that only the best beam quality product of the beam bundles 9 is impaired by the superposition.

The beam parameter product (English: "beam quality product") serves as a yardstick for the focusing ability of a beam bundle 9. The beam quality product is the product of the numerical aperture multiplied by half the diameter of the radiant surface. The smaller this product, the better the focusing ability.

For the numerical example, five diode lasers 1 are assumed, the radiant surfaces of which amount in each case to 400 $\mu$m $\times$ 1 $\mu$m. The major width of the surface of 400 $\mu$m lies in the p-n plane. The height of 1 $\mu$m lies perpendicularly to the p-n plane. The 400 $\mu$m have an aperture angle of about 5°, i.e. a numerical aperture of about 0.1, and the 1 $\mu$m has an aperture angle of 20° to 30°, i.e. a numerical aperture of about 0.4. All of p-n planes of the diode lasers 1 lie in one plane and, respectively, in parallel to one another. The individual diode lasers 1 are spaced apart from one another by 2 mm.

The above beam quality product yields, considering only a single diode wherein forty strips are linearly arranged in integrated fashion, a value of 20 $\mu$m in the p-n plane of the individual diodes and, perpendicularly thereto, a value of 0.2 $\mu$m. In other words, the focusing ability in this simplified way of considering the situation is one hundred times as poor in the p-n plane than perpendicularly to the p-n plane.

By imaging with the above-described apparatus, the above beam quality product is not changed for the aperture angle of 20° to 30°. The beam quality product of 0.2 $\mu$m for the aperture angle of about 5° results, for the five diode lasers 1, in 0.2 $\mu$m $\times$ 5 $\times$ 2 = 2.0 $\mu$m, in case of an imaging wherein the radiation-free interspace between respectively two beam bundles 9 is as wide as the beam bundle 9 (i.e. an optical modulation ratio of 2). In other words, theoretically, fifty diode lasers 1 having the above data could be arranged in side-by-side relationship before a beam quality product of 20 $\mu$m is attained in all planes perpendicularly to the propagation direction of the beam bundles 9.

An exemplary structure of the apparatus will be described below. The first, noncentrically imaging functional element 5 comprises, as illustrated in FIG. 3, starting with the diode lasers 1, a solid cylinder 19 of quartz glass with a diameter of 200 $\mu$m and two identical, planar-convex cylinder lenses 21 and 22 of SFL6 having a thickness of 1.44 mm. The radius of the cylindrical lenses 21 and 22 amounts to 3.56 mm. Both cylindrical lenses 21 and 22 are spaced apart from each other by 1.82 mm. The cylindrical lens 21 has a spacing of 0.1 mm from the solid cylinder 19, and the cylindrical lens 22 has a spacing of 0.1 mm from the beam-rotating element 7. For an aperture angle of $\pm 30°$ at the input of the functional element 5, a beam height results of $\pm 0.5$ mm.

The second noncentrically imaging functional element 11 consists of a single planar-convex cylindrical lens of SFL6 with a thickness of 3 mm, the axis of which lies in parallel to the p-n plane. The radius of the cylindrical lens is 35.6 mm. The planar surface of the cylindrical lens is arranged at a distance of 32 mm from the output of the beam-rotating element 7.

An Abbe-König prism 27 is utilized as the beam-rotating element 7 for each individual diode laser 1. The Abbe-König prism 27 is rotated about its plane of symmetry and about the plane of symmetry of each beam 9 by 45° in the optical axis. For the sake of simplifying the illustration, the Abbe-König prism 27 is shown in FIG. 4b in a view laterally inclined by 45°. FIG. 4a shows the beam 9 impinging on the Abbe-König prism 27, and FIG. 4c shows the beam 9 leaving the prism 27, likewise in a representation rotated by 45°. The marginal beams of the rectangular beam 9 are denoted by a, b, c, and d. The beam boundaries a-b and c-d FIG. 4a have already been oriented in parallel by the functional element 5 whereby their spacings a/d and b/c, respectively, are not changed even after passing through the prism 27, while the beam boundaries a-d and b-c, not yet imaged by the functional element 11, diverge on account of the aperture angle of the beam 9 emerging from the respective diode 1, as can be seen from the increased spacings a/b and d/c in FIG. 4c. The rotation of the beam 9 by the prism 27 can be recognized from the fact that, in FIG. 4a, the marginal beam a is at the top and, in FIG. 4c, at the bottom; and the marginal beam c in in FIG. 4a is at the bottom and, in FIG. 4c, at the top. The marginal beams b and d are not interchanged laterally.

The functional elements 5 and 11 as well as the beam-rotating element 7 produce, from the beam bundles 9 of the five diode lasers 1 arranged in a row in a grid of 2 mm, five rectangular beam bundles of parallel light having a width of 1 mm, in the same grid.

By means of reflecting combs, not shown, respectively one further beam bundle can be reflected with a second apparatus into the interspaces between the beam bundles.

The height of the rectangular beam bundle 9 can be adjusted arbitrarily by the focal length of the second functional element 11. With the above exemplary values, this height is here about $\pm 4.5$ mm. The total beam cross section thus amounts to about 9 mm $\times$ 9 mm in case of the five diode lasers. By a suitable choice of the functional elements, any type of beam cross section can be set.

In place of the Abbe-König prism 27, it is possible to employ, depending on the specific usage, inter alia Schmidt-Pechan prisms, Leman-Springer prisms, etc.

In place of the spherical lens 15, it is likewise possible to utilize two cylindrical lenses, not shown, which are disposed perpendicularly to each other.

The selection of the imaging functional elements is dependent on the aperture angles of the diode lasers 1.

Thus it is not absolutely necessary to perform the imaging operation starting with the diode lasers 1 as the radiation sources with a noncentric imaging, then a beam rotation, and a further noncentric imaging. It is also possible to first effect a beam rotation, starting from the diode lasers 1.

We claim:

1. A method for imaging several radiation-sources (1) into a spatial-zone (3) comprising,
    arranging said radiation-sources in one or several rows,
    emitting a beam (9) of radiation from each radiation-source,
    each beam (9) having a spatial intensity distribution that is not rotationally symmetrical in a plane (IVa—IVa, IVb—IVb) perpendicular to the direction of propagation of the beam (9),
    spatially rotating said beam (9) by a rotation-angle about their direction of propagation by first optical means (7), and imaging said beam into said spatial-zone (3) by second optical means (5, 11, 15).

2. A method according to claim 1, wherein
    each beam (9) emitted from each radiation source (1) having a largest and a smallest beam quality product evoked by a largest and a smallest aperture-angle of the radiation of each beam (9),
    forming a difference-angle from the angle-bisector of said smallest and the angle-bisector of said largest aperture-angle in said plane, and
    said rotation of each of said beams being done by said first optical means (7) by said rotation-angle equal to said difference-angle.

3. A method according to claim 1, wherein
    said imaging step includes a first imaging-step done by said second optical means (5) in the optical-path of each beam (9) between the radiation-sources (1) and said first optical means (7), and
    said first imaging-step being a noncentrical imaging of each beam (9).

4. A method according to claim 3 for imaging the radiation of radiation-sources (1) of at least one diode-array, including
    arranging said radiation-sources (1) in one row forming the diode-array,
    each beam (9) emitted form each radiation source (1) having a largest and a smallest beam quality product evoked by a largest and a smallest aperture-angle of the radiation of each beam (9),
    forming a difference-angle from the angle-bisector of said smallest and the angle-bisector of said largest aperture-angle in said plane,
    said smallest and said largest aperture-angle respectively of each emitted beam of said array being spatially parallel to one another,
    making a first beam-shape-part of each beam (9) emitted by each radiation-source (1) parallel to a first plane perpendicular to the angle-bisector of said largest aperture-angle by said first imaging-step by a first part (5) of said second optical means (5, 11, 15),
    spatially rotating said beams with first beam-shape-parts parallel to said first plane, by said rotation-angle by said first optical means (7), and subsequently
    making a second beam-shape-part of each beam (9) parallel to a second plane perpendicular to the angle-bisector of said smallest aperture-angle by a second part (11) of said second optical means (5, 11, 15), and
    then focussing by a third part (15) of said second optical means (5, 11, 15) into said spatial-zone (3).

5. Apparatus for imaging several radiation-sources (1) into a spatial-zone (3), comprising
    said sources (1) being arranged in one or several rows,
    each said source (1) emitting a beam (9) with a radiation intensity having a spatial-intensity-distribution not rotationally symmetrical,
    said apparatus having two imaging-function-elements (5, 11, 15) and one beam-rotating-element (7) for rotating said spatial-intensity-distribution by a rotation-angle in a plane perpendicular to the propagation direction of said beam (9),
    said beam-rotating-element (7) being arranged between said sources (1) and said spatial-zone (3).

6. Apparatus according to claim 5, wherein
    each beam (9) form said sources having a largest and a smallest beam-quality-product evoked by a largest and a smallest aperture-angle of the radiation of each beam (9),
    an angle-bisector of said smallest and an angle-bisector of said largest aperture-angle being separated by a difference-angle in the plane perpendicular to the propagation direction of said beam, and
    said beam-rotating-element (7) rotating each beam (9) of each of said sources (1) by a rotation-angle equal to said difference-angle, especially by 90°.

7. Apparatus according to claim 6, wherein
    a second (11) of said two imaging-function-elements (5, 11, 15) arranged between said beam-rotating-element (7) and said spatial-zone (3),
    said second imaging-function-element being a noncentrical imaging-function-element (11), and
    said second imaging-function-element (11) being arranged for reducing said smallest aperture-angle of each beam (9) rotated by said beam-rotating-element (7).

8. Apparatus according to claim 7, including
    a third imaging-function-element (15) arranged between said second imaging-function-element (11) and said spatial-zone (3), and
    said third imaging-function-element being a centrally focussing-function-element (15) for focussing said beam (9) into said spatial-zone (3).

9. Apparatus according to claim 5, wherein
    said beam-rotating-element (7) has respectively one reversing-prism (27) per radiation-source (1).

10. Apparatus according to claim 5, wherein
    a first (5) of said two imaging-function-elements (5, 11, 15) arranged between said rotation-source (1) and said beam-rotating-element (7),
    said first imaging-function-element (5) being a noncentrical imaging-function-element (5), and
    said first imaging-function-element (5) being arranged for reducing said largest aperture-angle of each beam (9).

11. Apparatus according to claim 5, in which said two imaging-function-elements are noncentrical imaging-function-elements and comprise cylindrical lenses, the beams from said sources being respectively in partial, and said cylindrical lenses located in the path of the beams from said sources operative to maintain the beams approximately in parallel.

12. Apparatus according to claim 5, in which said radiation-sources comprise at least one diode laser array, the radiation from which is imaged into said spatial-zone.

13. Apparatus for imaging several radiation-sources (1) into a spatial-zone (3), comprising said sources (1) being arranged in at least two rows, each said source (1) emitting a beam (9) with a radiation intensity having a spatial-intensity-distribution not rotationally symmetrical, said apparatus having two noncentrical imaging-function-elements (5, 11, 15) and one beam-rotating-element (7) for rotating said spatial-intensity-distribution by a rotation-angle in a plane perpendicular to the propagation path of said beam (9), said beam-rotating-element (7) being arranged between said sources (1) and said spatial-zone (3), and at least one reflecting comb positioned after said beam-rotating-element and said imaging-function-elements in the propagation path of said beams and before said spatial-zone to combine the beams from said at least two rows of radiation sources.

* * * * *